(12) United States Patent
Yusuf et al.

(10) Patent No.: US 6,310,773 B1
(45) Date of Patent: Oct. 30, 2001

(54) HEAT SINK SYSTEM

(75) Inventors: Imran Yusuf, Tempe; Biju Chandran, Chandler, both of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/470,322

(22) Filed: Dec. 21, 1999

(51) Int. Cl.[7] .................................. H05K 7/20; H05K 9/00
(52) U.S. Cl. .......................... 361/704; 165/80.2; 165/185; 174/16.3; 174/35 R; 174/35 GC; 257/719; 257/818
(58) Field of Search .................... 165/80.2, 185; 174/16.3, 35 R, 35 GC; 257/707, 713, 718–719, 726–727; 361/704, 707, 709–710, 719–720, 816, 818

(56) References Cited

U.S. PATENT DOCUMENTS

| | | | |
|---|---|---|---|
| 4,993,482 | * | 2/1991 | Dolbear et al. .................. 165/388 |
| 5,654,876 | * | 8/1997 | Sathe et al. ..................... 361/704 |
| 5,870,285 | * | 2/1999 | Kosteva et al. .................. 361/704 |
| 5,920,120 | * | 7/1999 | Webb et al. ..................... 257/719 |

* cited by examiner

*Primary Examiner*—Gregory Thompson
(74) *Attorney, Agent, or Firm*—Schwegman, Lundberg, Woessner & Kluth, P.A.

(57) ABSTRACT

A heat dissipation system for an integrated circuit assembly uses a compressible support structure to support a cooling solution, or heat sink, that dissipates heat generated by an integrated circuit. The compressible support structure, in one embodiment, is a deformable tube that is supported by a base structure. The tube, heat sink and base can be formed from a conductive material to provide an EMI shield for the integrated circuit. Retention mechanisms are used to provide either a fixed or an adjustable compression force to place the heat sink in thermal contact with the integrated circuit. The compressible support structure supports the heat sink, but also absorbs vibration and shock forces exerted on the heat sink to reduce the amount of forces transferred to the integrated circuit.

19 Claims, 2 Drawing Sheets

HEAT SINK SYSTEM

TECHNICAL FIELD OF THE INVENTION

The present invention relates generally to heat dispersement and in particular the present invention relates to removing heat from circuitry.

BACKGROUND OF THE INVENTION

Electronic devices, such as integrated circuits, often generate heat as a result of electric current conducted through the devices. As such, the evolution of integrated circuits that contain more densely populated circuit components results in the generation of an increased amount of heat. This heat is often dissipated through heat sinks. These heat sinks are thermally coupled to the integrated circuit packages and often physically rest upon the packages. As a result of increased heat generation, the size of the heat sinks needs to increase to effectively dissipate the increased heat.

The integrated circuit packages can be relatively fragile. Thus, the weight of the increased heat sinks can create problems. The integrity of the integrated circuits can be jeopardized by the heat sinks. This is particularly applicable when the integrated circuit and heat sink are subjected to vibrations.

In addition to the heat generation, integrated circuitry can be susceptible to electro-magnetic interference (EMI). EMI can lead to operational interruption, or even circuit destruction. This interruption or destruction is a result of radiated signals that reach the integrated circuit. To protect components from EMI, designers typically provide a shield around the sensitive circuit components.

The number of transistors contained in a microprocessor, as well as the processor operating speed, has increased dramatically. Correspondingly, the amount of heat that needs to be dissipated, and the amount of EMI emissions that need to be absorbed have increased. As a result, most of today's microprocessor based computer systems employ either local fans and/or heat sinks to help ensure that the microprocessors will run cool. At the same time, increased attention has been given to the design of system chassis to ensure that adequate levels of EMI emission absorption are met. The trend to increase transistor density and operating speed is expected to continue. It is expected that because of the amount of heat that needs to be dissipated, the precision of bonding between the processor package and a heat sink will reach a point of critical importance. That is, the physical bond between the processor package and the heat sink plays a critical role in heat dissipation.

For the reasons stated above, and for other reasons stated below which will become apparent to those skilled in the art upon reading and understanding the present specification, there is a need in the art for a thermal cooling system that allows for heat dissipation without stressing an integrated circuit during vibrations. A thermal cooling system is also desired that assists in EMI shielding.

SUMMARY OF THE INVENTION

The above mentioned problems and other problems are addressed by the present invention and will be understood by reading and studying the following specification.

In one embodiment, a heat dissipation system comprises a heat sink, a deformable support structure to provide vertical support for the heat sink, and a base support structure to retain the deformable support structure.

In another embodiment, an integrated circuit assembly comprises a substrate, an integrated circuit coupled to the substrate, a heat sink thermally coupled to a top surface of the integrated circuit, a deformable support structure to provide vertical support for the heat sink, and a base support structure coupled to the substrate to support and retain the deformable support structure.

In yet another embodiment, an assembly comprises a processor substrate, an integrated circuit processor package having electrical connections coupled to the processor substrate via an intermediate electrical socket, and a heat sink having a bottom surface that is thermally coupled to a top surface of the integrated circuit processor package. A plurality of deformable support structures are vertically located below the heat sink to provide vertical support for the heat sink, and a plurality of base support structures are vertically located below the plurality of deformable support structures. The plurality of base support structures are coupled to the processor substrate to support and retain the plurality of deformable support structures. A retention mechanism is coupled to the heat sink to provide a downward force on the heat sink. The downward force maintains the thermal coupling between the heat sink and the top surface of the integrated circuit processor package. The downward force further compresses the plurality of deformable support members.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Figure 1A:
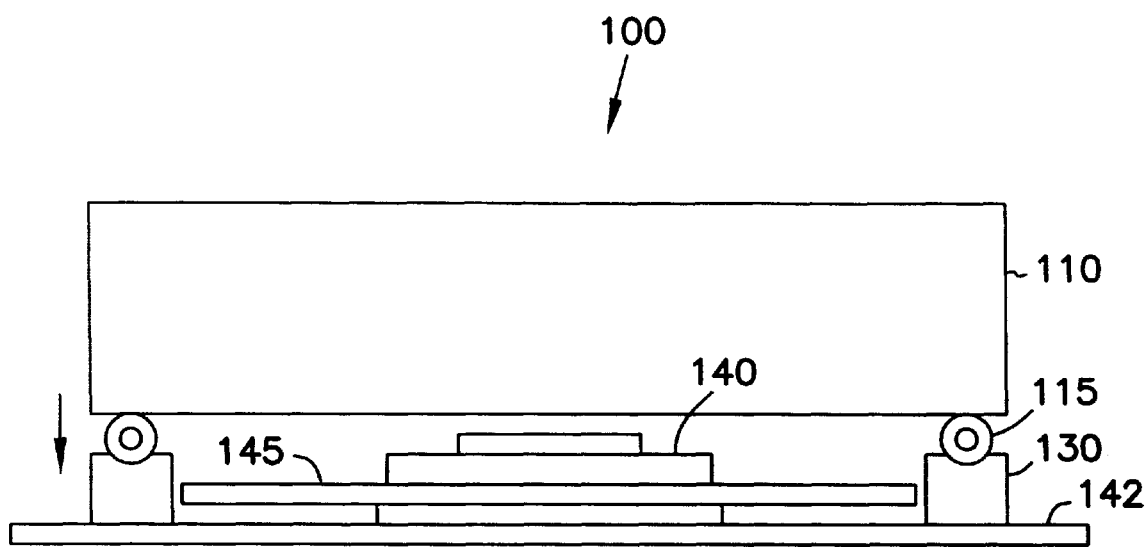
FIG. 1A is a side view of one embodiment of a cooling system of the present invention.

Referring to FIG. 1A, a side view is provided on a cooling system 100 according to one embodiment of the present invention. The system includes a cooling solution 110, a circuit component 140, support components 115 and base support structures 130. The circuit component is coupled to a substrate 142 using a mounting socket 145. The cooling solution can be any type device used to dissipate heat from the circuit component. For example, the cooling solution can be a heat sink constructed from a metallic material. Other mounting systems are contemplated for the integrated circuit, and the present invention is not limited to any particular type of mounting socket. Some sockets may require that a downward force be maintained on the integrated circuit to insure electrical contact. As explained below, the present invention can maintain this downward pressure by selecting an appropriate retaining mechanism and an appropriate support component.

Heat sink designs vary, and the present invention is not limited to any specific design. In general, in one embodiment the cooling solution can comprise a heat sink that includes a base and a heat-dissipating region. The heat dissipation region can be fins or rods that provide large surface areas for spreading heat. A fan is often used to provide air movement to increase the amount of heat dissipated over time. Heat sinks can be made of material with good heat dissipation characteristics, such as aluminum and copper. The size of heat sinks, and resultant weight, has resulted in need for supports to reduce the weight carried by the integrated circuit.

To dissipate heat generated by an integrated circuit, a heat sink is often applied to the side of the integrated circuit opposite the side from which electrical pin connections are mounted, such that the heat sink is oriented extending away from the substrate, or printed circuit board, to which the integrated circuit is mounted. Such heat sinks are often connected to the integrated circuit package by means of a spring clip, a bar clip, or other clip mechanism that secures the heat sink on top of and in secure physical contact with the integrated circuit. In some applications, a thermally conductive material is applied between the surfaces of the heat sink and the integrated circuit, to further ensure a good thermal connection between the two devices. Such mounting mechanisms have proven effective for mounting heat sinks to many devices, in part because the low mass of the heat sinks used has allowed use of clips and other retention mechanisms that produced little physical force on the integrated circuit.

But, as integrated circuits increase in complexity, they become more difficult to mount and sink heat adequately. Faster integrated circuits with denser internal circuitry produce more heat over a given physical area than previous generations of integrated circuits. Also, the greater amount of circuitry on more dense integrated circuits may require heat sinks that are physically larger than the top surface of the integrated circuit, or that have other larger or more complex geometries.

Referring again to FIG. 1A, circuit component 140 can be an integrated circuit, such as a processor circuit. The circuit can be coupled to the substrate via an electrical socket or a motherboard. It will be appreciated by those skilled in the art with the benefit of the present invention that the weight of the cooling solution may be excessive if it is only physically supported by the electronic component. That is, to effectively dissipate heat from the electronics, the cooling solution must be in thermal contact with the circuit package. This requires that the cooling solution be in direct contact with the package, or that the cooling solution be in contact with the package through an intermediate agent such as thermal grease.

To alleviate possible stress on the circuit and its supports, at least one base support structure 130 is used. This support structure is used to couple some of the weight of the cooling solution to substrate 142. The cooling solution, however, is not directly supported by the base support structure. An intermediate support component 115 is placed between the cooling solution and the base support. The intermediate support component is made from a material that can be deformed under stress or pressure. In one embodiment, the support component comprises a rubber-type material. It is desirable to fabricate the support component from a material that provides some compression or spring component, as explained below. Further, the support comport component can be fabricated from a material that has the ability to conduct electricity. For example, the material may contain metallic material or have an exterior coating of metallic material.

Figure 1B:
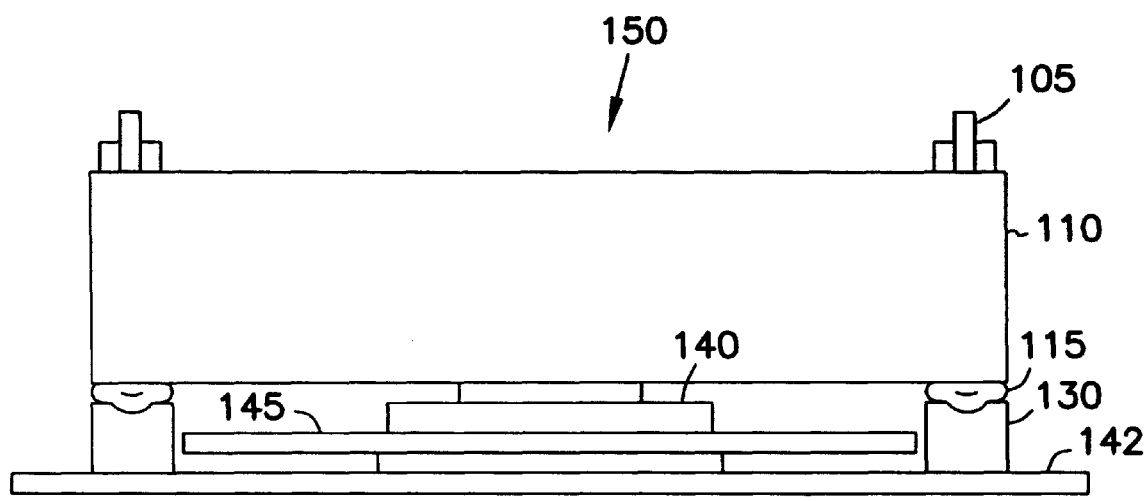
FIG. 1B is a side view of another embodiment of a cooling system of the present invention.

As assembled, the cooling solution rests on the support material. In one embodiment, the support material and the base support have a vertical height that prevents the cooling solution from contacting the circuit. As illustrated in FIG. 1B, a fastener 105 can be provided to compress the support material 115 to allow for thermal contact between the circuit and the cooling solution. In this system 150, a substantial amount of the weight of the cooling solution is carried by base supports 130 and support material 115. Again, selecting the fastener strength and a material for the support material allows the amount of downward pressure applied to the integrated circuit package/mounting location to be controlled. This pressure may be needed for different types of electrical mounting systems, referred to generally herein as a mounting socket.

As explained below, the support material has absorption properties to reduce stress placed on the circuit during shock and vibration events. The fastener(s) of the present invention are not limited to a specific embodiment. In one embodiment, the fastener comprises an adjustable clamp-type device that allows the amount of downward compression force applied to the cooling solution to be adjusted. This allows the thermal contact between the cooling solution and the circuit to be controlled without providing undue stress on the circuit.

Figure 2:
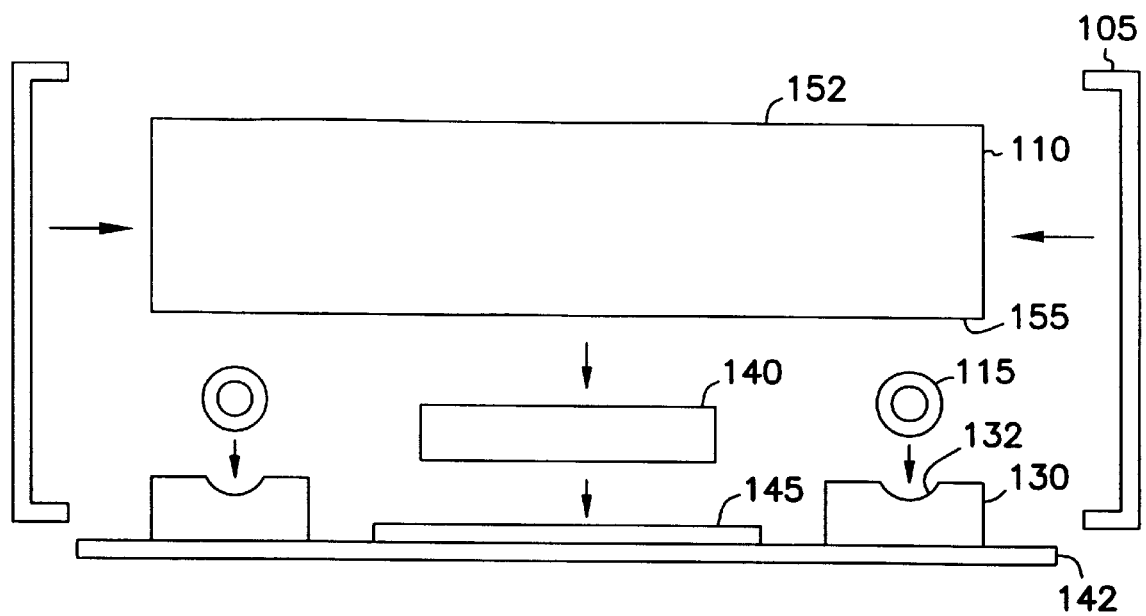
FIG. 2 is an exploded view of another embodiment of a cooling system of the present invention.

Referring to FIG. 2, an exploded side view of one embodiment of the present invention. This embodiment uses a clip(s) to secure the cooling solution 110 to the support system. The clips are spring-type clips that provide a pre-defined compression force between the support system and the cooling solution 110. In the illustrated embodiment, the clips couple a top surface 150 of the cooling solution and the base support 130. The spring clip provides a downward force such that a bottom surface 155 of the cooling solution comes in contact with the circuit 140 and support material 115. The clip can couple any suitable feature of cooling solution and is not limited to the top surface. Likewise, the clip can be coupled to the substrate and not the base support. It will be appreciated that different types of retention mechanisms can be used and the present invention is not limited to clips or clamps as described. In fact, one embodiment can include both a fixed compression retention mechanism such as a spring clip and an adjustable retention mechanism such as a clamp.

The support components 115 can be fabricated as a tube structure having a generally round exterior cross-section in an uncompressed state. The tube rests in a groove 132 formed in a top surface of the base support structures. Other embodiments are contemplated and the present invention is not limited to a tube. For example, a solid support component could be used. Further, a support component could be implemented that overlaps the base supports and does not rest in a groove, or like feature.

Figure 3:
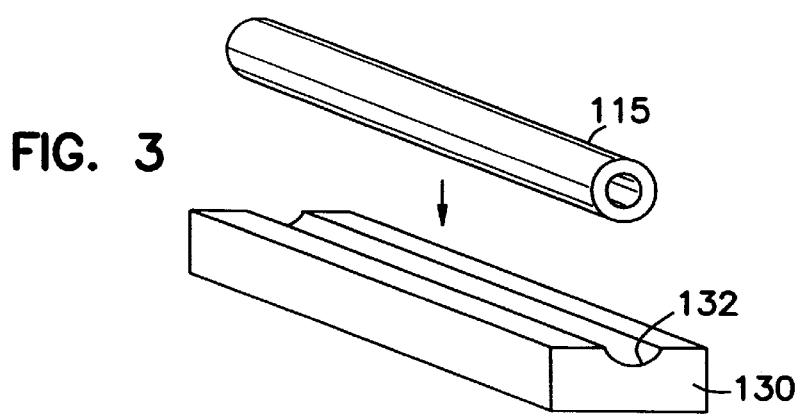
FIG. 3 is a perspective view of some components of the embodiment of FIG. 2.

In one embodiment, the cooling solution, support components and base supports are constructed of a material that is capable of conducting electricity. For example, these components can all contain some percentage of metallic material. By coupling these components to a ground potential provided on via the substrate, an EMI shield can be formed to provide a level of protection for the circuit 140. That is, the base supports and support structures provide lateral walls, or shields, while the cooling solution provides a horizontal shield over the circuit. A ground plane on the substrate can be provided to protect the bottom of the circuit. It will be appreciated that the base support and support structures can be con figured to support the cooling solution from two, three or four sides. That is, the base support and support structures can be formed in a U-shape to support three sides, or in an O-shape to support four sides. Those skilled in the art can provide different shapes after studying the present description. FIG. 3 illustrates a linear base support 130 having a groove 132 to support the tube shaped support structure 115.

Figure 4:
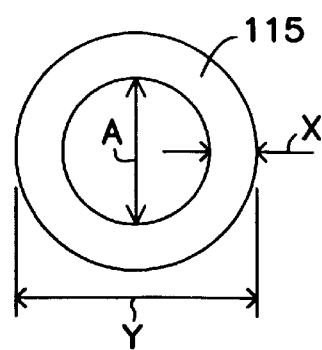
FIG. 4 is an end view of one embodiment of a support component in an uncompressed state.
Figure 5:
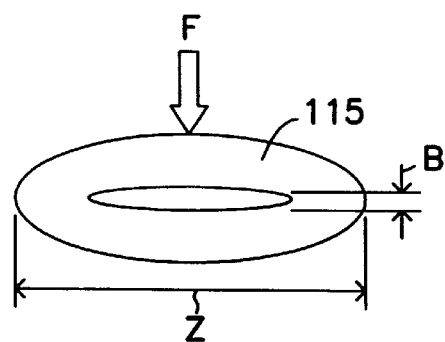
FIG. 5 is an end view of the support component in a compressed state.

Referring to FIG. 4, an end view of a support component 115 is illustrated. In an uncompressed state, the support structure has an interior diameter of A, an exterior diameter of Y and a cross section thickness of X. Referring to FIG. 5, a downward force F has been applied to the support structure. The interior shape has been changed to have vertical interior height B that is less than A. Likewise, the exterior shape now has a horizontal dimension Z that is greater than Y.

CONCLUSION

A heat dissipation system has been described that uses a compressible support structure to support a cooling solution. The cooling solution can be a heat sink that dissipates heat generated by an integrated circuit. The compressible support structure, in one embodiment, has been described as a deformable tube that is supported by a base structure. The tube, heat sink and base can be formed from a conductive material to provide an EMI shield for the integrated circuit. Retention mechanisms have also been described to provide either a fixed or an adjustable compression force to place the heat sink in thermal contact with the integrated circuit. The compressible support structure, therefore, both supports the heat sink and also absorbs vibration and shock forces exerted on the heat sink to reduce the amount of forces transferred to the integrated circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A heat dissipation system to remove heat from a circuit component, comprising:
   a heat sink to be thermally coupled to the circuit component;
   a vertically compressible support structure to provide vertical support for the heat sink; and
   a base support structure to retain the vertically compressible support structure, said base support structure being different from the circuit component;
   wherein the vertically compressible support structure comprises a tube shaped flexible structure and the base support structure comprises a groove to retain the tube shaped flexible structure.

2. The heat dissipation system of claim 1 wherein the vertically compressible support structure is formed from a rubber-type material.

3. The heat dissipation system of claim 1 wherein the vertically compressible support structure comprises a compressible material having electrical conductive properties.

4. The heat dissipation system of claim 1 further comprising a retention mechanism coupled to the heat sink and to the base support structure to provide a downward force on the heat sink to at least partially compress said vertically compressible support structure between said heat sink and said base support structure.

5. The heat dissipation system of claim 4 wherein the retention mechanism comprises an adjustable clamp.

6. The heat dissipation system of claim 4 wherein the retention mechanism comprises a spring clip.

7. An integrated circuit assembly comprising:
   a substrate;
   an integrated circuit coupled to the substrate;
   a heat sink thermally coupled to a top surface of the integrated circuit;
   a vertically compressible support structure to provide vertical support for the heat sink; and
   a base support structure coupled to the substrate to support and retain the vertically compressible support structure;
   wherein the vertically compressible support structure comprises a tube shaped flexible structure and the base support structure comprises a groove to retain the tube shaped flexible structure.

8. The integrated circuit assembly of claim 7 further comprising a retention mechanism coupled to the heat sink and to the base support structure to provide a downward force on the heat sink, the downward force maintaining the thermal coupling between the heat sink and the top surface of the integrated circuit, the downward force further compressing the vertically compressible support structure.

9. The integrated circuit assembly of claim 8 wherein the retention mechanism is adjustable to allow selection of a level of the downward force.

10. The integrated circuit assembly of claim 8 wherein the retention mechanism is a spring-type clip that provides a preselected downward force to the heat sink.

11. The integrated circuit assembly of claim 7 wherein the heat sink, vertically compressible support structure and the base support structure each comprise electrical conductive properties.

12. The integrated circuit assembly of claim 11 wherein the heat sink, vertically compressible support structure and the base support structure are coupled to a ground potential connection to form an EMI shield for the integrated circuit.

13. The integrated circuit assembly of claim 7 wherein the integrated circuit is a processor circuit.

14. An assembly comprising:

a processor substrate;

an integrated circuit processor package having electrical connections coupled to the processor substrate via an intermediate electrical socket;

a heat sink having a bottom surface that is thermally coupled to a top surface of the integrated circuit processor package;

a plurality of vertically compressible support structures vertically located below the heat sink to provide vertical support for the heat sink;

a plurality of base support structures vertically located below the plurality of vertically compressible support structures, the plurality of base support structures are coupled to the processor substrate to support and retain the plurality of vertically compressible support structures; and a retention mechanism coupled to the heat sink and to the processor substrate to provide a downward force on the heat sink, the downward force maintaining the thermal coupling between the heat sink and the top surface of the integrated circuit processor package, the downward force further compressing the plurality of vertically compressible support structures.

15. The assembly of claim 14 wherein the retention mechanism is either a spring-type clip that provides a preselected downward force to the heat sink, or an adjustable clamp to allow selection of a level of the downward force.

16. The assembly of claim 14 wherein the heat sink, plurality of vertically compressible support structures and the plurality of base support structures each comprise electrical conductive properties and are coupled to a ground potential connection located on the processor substrate to form an EMI shield for the integrated circuit.

17. A method of providing EMI protection for an integrated circuit, the method comprising:

coupling a metallic heat sink to an electrically conductive, vertically compressible support structure and a base support structure; and coupling the metallic heat sink, vertically compressible support structure and base support structure to a ground potential to provide EMI shielding about an integrated circuit thermally coupled to the heat sink;

wherein the electrically conductive vertically compressible support structure is a flexible tube fabricated from a material containing metallic particles.

18. The method of claim 17 wherein the metallic heat sink is thermally coupled to the integrated circuit using a retention mechanism that at least partially compresses said vertically compressible support structure between said heat sink and said base support structure.

19. An integrated circuit assembly comprising:

a substrate;

an integrated circuit coupled to the substrate;

a heat sink thermally coupled to a top surface of the integrated circuit;

a deformable support structure to provide vertical support for the heat sink; and a base support structure coupled to the substrate to support and retain the deformable support structure;

wherein the deformable support structure comprises a tube shaped flexible structure and the base support structure comprises a groove to retain the tube shaped flexible structure.

* * * * *